(12) United States Patent
Miyahara et al.

(10) Patent No.: US 7,723,784 B2
(45) Date of Patent: May 25, 2010

(54) INSULATED GATE SEMICONDUCTOR DEVICE AND METHOD FOR MANUFACTURING THE SAME

(75) Inventors: Syouji Miyahara, Gunma (JP); Daichi Suma, Gunma (JP)

(73) Assignees: Sanyo Electric Co., Ltd., Moriguchi-shi (JP); Sanyo Semiconductor Co., Ltd., Gunma (JP)

( * ) Notice: Subject to any disclaimer, the term of this patent is extended or adjusted under 35 U.S.C. 154(b) by 0 days.

(21) Appl. No.: 12/399,649

(22) Filed: Mar. 6, 2009

(65) Prior Publication Data

US 2009/0230515 A1    Sep. 17, 2009

(30) Foreign Application Priority Data

Mar. 14, 2008    (JP) ............................. 2008-066295

(51) Int. Cl.
  H01L 29/76      (2006.01)
  H01L 29/94      (2006.01)
  H01L 31/062     (2006.01)
(52) U.S. Cl. .................... 257/330; 257/328; 257/331; 438/257; 438/270
(58) Field of Classification Search ......... 257/328–331, 257/335, E29.256, E29.261, E29.111, E21.135; 438/259, 270–271
See application file for complete search history.

(56) References Cited

U.S. PATENT DOCUMENTS 6,872,611 B2 *    3/2005    Takemori et al. ............. 438/197
7,462,910 B1 *    12/2008   Kinzer ........................ 257/330

FOREIGN PATENT DOCUMENTS

JP    2000-200902    7/2000

* cited by examiner

*Primary Examiner*—Theresa T Doan
(74) *Attorney, Agent, or Firm*—Morrison & Foerster LLP (57) ABSTRACT

A well region in which an insulated gate semiconductor element is formed is a diffusion region, and an impurity concentration of the well region is lower toward its bottom portion. This leads to a problem of increased resistance. Therefore, particularly, an insulated gate semiconductor element having an up-drain structure has a problem of increased on-resistance. A p type well region is formed by stacking two p type impurity regions on one another. The p type impurity regions are allowed to serve as the p type well region by sequentially stacking n type semiconductor layers, on one another, having p type impurities implanted into their surfaces and simultaneously diffusing the impurities by heat treatment. In this way, it is possible to obtain the p type well region in which an impurity concentration sufficient to secure a desired breakdown voltage is maintained approximately uniform up to a desired depth.

3 Claims, 8 Drawing Sheets

Prior Art

INSULATED GATE SEMICONDUCTOR DEVICE AND METHOD FOR MANUFACTURING THE SAME

This application claims priority from Japanese Patent Application Number JP 2008-066295, filed on Mar. 14, 2008, the content of which is incorporated herein by reference in its entirety.

BACKGROUND OF THE INVENTION

1. Field of the Invention

The present invention relates to an insulated gate semiconductor device and a method for manufacturing the same, and more specifically relates to an insulated gate semiconductor device which realizes on-resistance reduction in an up-drain structure having a drain electrode provided on the same principal surface as a source electrode, and a method for manufacturing the same.

2. Description of the Related Art

There has been known an insulated gate semiconductor device having a so-called up-drain structure which enables surface mounting by drawing a drain region onto a principal surface of a substrate where a source electrode is formed. This technology is described for instance in Japanese Patent Application Publication No. 2000-200902.

Figure 10:
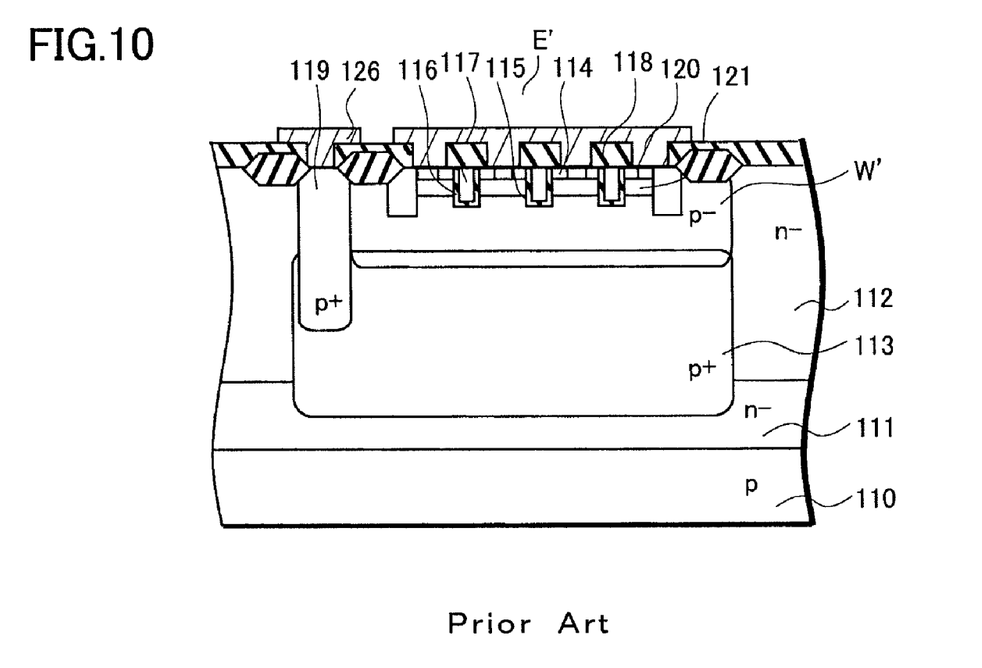
FIG. 10 is a cross-sectional view showing a conventional insulated gate semiconductor device.

With reference to a cross-sectional view of FIG. 10, description will be given of a conventional insulated gate semiconductor device having a so-called up-drain structure which enables surface mounting, by taking a MOSFET as an example.

On a p type silicon semiconductor substrate 110, n− type semiconductor layers 111 and 112 are provided. Moreover, a p+ type impurity region 113 is provided to extend to the n− type semiconductor layer 111 from the n− type semiconductor layer 112. A p type impurity region (p type well region W') is provided in a surface of the n− type semiconductor layer 112 and an element region E' of a MOSFET is provided in a surface of the p type well region W'.

In the element region E', trenches 115 are provided in an n− type channel layer 121, inner walls of the trenches 115 are covered with gate insulating films 116, and gate electrodes 117 are embedded in the trenches 115. In the surface of the p type impurity region W' adjacent to the trench 115, a p+ type source region 114 is provided. Each of the trenches 115 is covered with an interlayer insulating film 118, and a source electrode 120 is provided so as to be connected to the source region 114 in each cell.

On the n− type semiconductor layer 112, a drain electrode 126 is provided. The drain electrode 126 comes into contact with a high concentration p type impurity region 119 provided in the n− type semiconductor layer 112. The p type impurity region 119 comes into contact with the p+ type impurity region 113 buried in the n− type semiconductor layers 111 and 112 and forming a part of a drain region, and serves as a conductive path for drawing a drain current up to a surface of the substrate.

As described above, the MOSFET having the up-drain structure includes the p+ type impurity region (buried region) 113, the p type impurity region 119 serving as the conductive path for drawing up the drain current, and the low concentration p type impurity region (p type well region W'). Moreover, the element region E' of the MOSFET is formed in the p type well region W'.

However, an impurity concentration of the p type well region W' that is a diffusion region is lower toward its bottom portion. This leads to a problem of increased resistance. In the MOSFET having the up-drain structure, a current path is formed to extend in the buried region 113 and the p type impurity region 119 below the element region E'. However, since the impurity concentration is low at the bottom of the p type well region W', a resistance value of the current path in a direction perpendicular to the substrate is increased below the element region E'. This leads to a problem of increased on-resistance.

Moreover, since an impurity concentration of the buried region 113 is higher than that of the p type well region W', a degree of upward diffusion (so-called swelling) is sometimes increased by heat treatment in formation of the buried region 113.

Specifically, the buried region 113 extends to the p type well region W' layer by the swelling. Therefore, a desired depth for the p type well region W' layer can no longer be secured. This leads to a problem of breakdown voltage deterioration.

Moreover, the bottom portion of the p type well region W' is positioned at a depth of about 4.5 μm from its surface, for example. Therefore, there is a problem that ion implantation into this region to compensate for the lowered impurity concentration is difficult to perform even by use of high acceleration energy.

SUMMARY OF THE INVENTION

The invention provides an insulated gate semiconductor device that includes a p type semiconductor substrate, a first n type epitaxial semiconductor layer grown on the semiconductor substrate, a second n type epitaxial semiconductor layer grown on the first n type semiconductor layer, a third n type epitaxial semiconductor layer grown on the second n type semiconductor layer, an n type impurity-diffusion region buried between the semiconductor substrate and the first n type semiconductor layer, a first p type impurity-diffusion region buried between the first n type semiconductor layer and the second n type semiconductor layer, a second p type impurity-diffusion region buried between the second n type semiconductor layer and the third n type semiconductor layer so as to be in contact with the first p type impurity-diffusion region, a third p type impurity-diffusion region formed in the third n type semiconductor layer so as to be in contact with the second p type impurity region, a region formed in the third p type impurity-diffusion region and comprising insulated gate semiconductor elements, a conductive region formed in the second and third n type epitaxial semiconductor layers outside the second and third p type impurity-diffusion regions so as to reach the first p type impurity-diffusion region, first and second electrodes connected to the region comprising insulated gate semiconductor elements, and a third electrode connected to the conductive region.

The invention also provides a method of manufacturing an insulated gate semiconductor device. The method includes providing a p type semiconductor substrate, implanting n type impurities into the p type semiconductor substrate, forming a first n type epitaxial semiconductor layer on the implanted semiconductor substrate, implanting p type impurities into the first n type epitaxial semiconductor layer, forming a second n type epitaxial semiconductor layer on the implanted first n type epitaxial semiconductor layer, implanting p type impurities into the second n type epitaxial semiconductor layer, forming a third n type epitaxial semiconductor layer on the implanted second n type epitaxial semiconductor layer, implanting p type impurities into a first portion of the third n type epitaxial semiconductor layer and implanting p type impurities into a second portion of the third n type epitaxial semiconductor layer at a dosage higher than a dosage of the first portion. The n type impurities and the p type impurities are thermally diffused so that an n type impurity-diffusion region is formed between the semiconductor substrate and the first n type semiconductor layer, a first p type impurity-diffusion region is formed between the first n type semiconductor layer and the second n type semiconductor layer, a second p type impurity-diffusion region is formed between the second n type semiconductor layer and the third n type semiconductor layer, a third p type impurity-diffusion region is formed in the third n type semiconductor layer so as to be in contact with the second p type impurity region, and a conductive region is formed in the second and third n type epitaxial semiconductor layers outside the second and third p type impurity-diffusion regions so as to have an impurity concentration higher than an impurity concentration of the third p type impurity-diffusion region. The method also includes forming insulated gate semiconductor elements in a region of the third p type impurity-diffusion region, forming first and second electrodes so as to be connected to the region in which the insulated gate semiconductor elements are formed and forming a third electrode so as to be connected to the conductive region.

DESCRIPTION OF THE INVENTION

An embodiment of the invention is described with reference to FIG. 1 through FIG. 9, using an p-channel trench-type MOSFET (Metal Oxide Semiconductor Field Effect Transistor).

Figure 1:
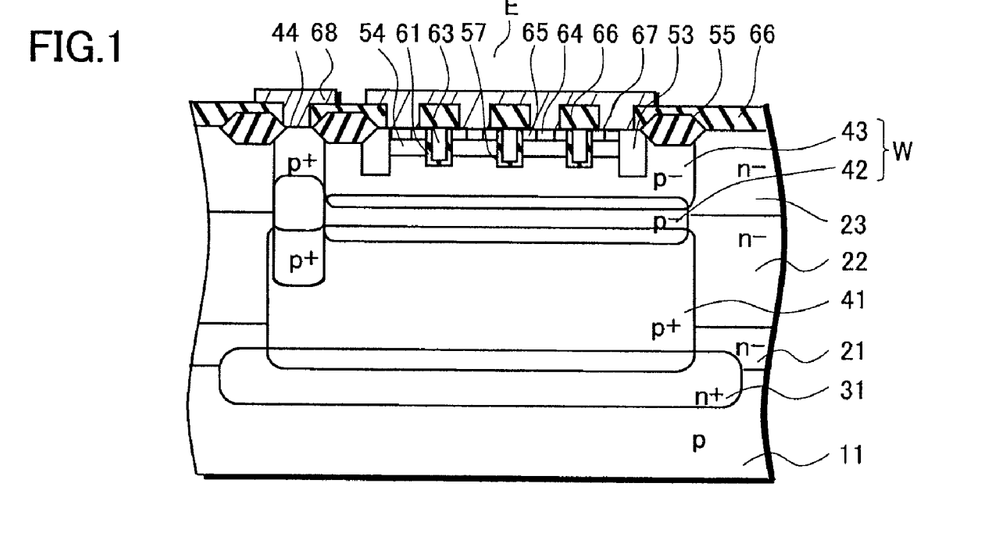
FIG. 1 is a cross-sectional view showing an insulated gate semiconductor device according to a preferred embodiment of the invention.

An insulated gate semiconductor device (MOSFET) of the preferred embodiment of the invention includes a p type semiconductor substrate, a first n type semiconductor layer, a second n type semiconductor layer, a third n type semiconductor layer, a high concentration n type impurity region, a first p type impurity region, a second p type impurity region, a third p type impurity region, an insulated gate semiconductor element region, a conductive region, a first electrode, a second electrode, and a third electrode.

A p type (p− type) silicon semiconductor substrate 11 has an impurity concentration of about 1.0E15 to 1.0E16 cm$^{-3}$. A MOSFET of the preferred embodiment has a so-called up-drain structure in which a drain electrode is provided on a same principal surface as a source electrode. The p type silicon semiconductor substrate 11 has a ground potential.

First to third n type semiconductor layers 21 to 23 are epitaxial layers, each having an impurity concentration of, for example, about 4.0E15 cm$^{-3}$ (specific resistance=1.2 Ω·cm) and thicknesses thereof are, for example, about 6 μm, 7 μm to 10 μm, and 6 μm to 10 μm, respectively.

The first n type semiconductor layer 21 is provided on the p type silicon semiconductor substrate 11, the second n type semiconductor layer 22 is provided on the first n type semiconductor layer 21, and the third n type semiconductor layer 23 is provided on the second n type semiconductor layer 22.

A high concentration n type (n+ type) impurity region 31 is buried in such a depth that the n type impurity region 31 extends to the p type silicon semiconductor substrate 11 from the first n type semiconductor layer 21. The n type impurity region 31 is a region obtained by diffusing impurities (for example, antimony (Sb)) in an interface between the first n type semiconductor layer 21 and the p type silicon semiconductor substrate 11 (a surface of the p type silicon semiconductor substrate 11). The n type impurity region 31 has an impurity concentration of about 1.0E19 cm$^{-3}$ and is also diffused upward toward the first n type semiconductor layer 21.

A first p type (p+ type) impurity region 41 is buried in such a depth that the first p type impurity region 41 extends to the first n type semiconductor layer 21 from the second n type semiconductor layer 22. The first p type impurity region 41 is a region obtained by diffusing high concentration of impurities (boron (B)) in an interface between the first and second n type semiconductor layers 21 and 22 (a surface of the first n type semiconductor layer 21). The first p type impurity region 41 has an impurity concentration of, for example, about 1.0E18 cm$^{-3}$ and is also diffused upward toward the second n type semiconductor layer 22. A lower portion of the first p type impurity region 41 is prevented from being excessively diffused into the p type silicon semiconductor substrate 11 by the n type impurity region 31.

Moreover, the n type impurity region 31 prevents a parasitic bipolar action caused by the p type silicon semiconductor substrate 11 having the ground potential, the first p type impurity region 41 having a potential (drain potential) higher than the ground potential, and the first n type semiconductor layer 21 sandwiched therebetween.

A second p type (p− type) impurity region 42 is buried in such a depth that the second p type impurity region 42 extends to the second n type semiconductor layer 22 from the third n type semiconductor layer 23. The second p type impurity region 42 is a region obtained by diffusing low concentration of impurities (boron) in an interface between the second and third n type semiconductor layers 22 and 23 (a surface of the second n type semiconductor layer 22). The second p type impurity region 42 has an impurity concentration of, for example, about $1.0E16$ cm$^{-3}$ and is also diffused upward toward the third n type semiconductor layer 23.

A third p type (p− type) impurity region 43 is provided in the third n type semiconductor layer 23. The third p type impurity region 43 is a region obtained by diffusing low concentration of impurities (boron, impurity concentration: for example, about $1.0E16$ cm$^{-3}$) in a surface of the third n type semiconductor layer 23. A bottom portion of the third p type impurity region 43 comes into contact with an upper portion of the second p type impurity region 42.

The second and third p type impurity regions 42 and 43 form a p type well region W. An upper surface of the second p type impurity region 42 comes into contact with the third p type impurity region 43, and a bottom surface thereof comes into contact with the first p type impurity region 41. In a bottom portion of the p type well region W, reduction in the p type impurity concentration is suppressed by the second p type impurity region 42.

Moreover, the p type well region W serves as a drain region of the MOSFET formed in an element region E, together with the first p type impurity region 41.

A conductive region 44 is a high concentration p type (p+ type) impurity region which is provided outside the p type well region W and has such a depth that the conductive region 44 extends to the first p type impurity region 41 from the surface of the third n type semiconductor layer 23. The conductive region 44 is connected to the first p type impurity region 41 serving as the drain region, and thus serves as a conductive path for drawing the first p type impurity region 41 to the surface of the third n type semiconductor layer 23. An impurity concentration of the conductive region 44 is, for example, about $1.0E18$ cm$^{-3}$.

In the surface of the p type well region W (the surface of the third p type impurity region 43), the element region E is formed. In the element region E, a MOSFET having, for example, a trench structure is formed.

In the MOSFET, the p type well region W and the first p type impurity region 41 serve as the drain region, and a channel layer 54 that is an n type impurity region is provided in the surface of the third p type impurity region 43. At a periphery of the channel layer 54, a guard ring 53 is provided by diffusing high concentration of n type impurities. The guard ring 53 relaxes a curvature at an edge portion of a depletion layer spreading into the third p type impurity region 43 from the channel layer 54 when a reverse bias is applied to the element region E. Note that the element region E of the preferred embodiment means a MOSFET formation region up to the guard ring 53.

Trenches 57 are formed so as to penetrate the channel layer 54 and extend to the third p type impurity region 43. The trenches 57 are generally patterned into a lattice or stripe form in the surface of the third n type semiconductor layer 23.

On inner walls of the trenches 57, gate oxide films 61 are provided. A thickness of each of the gate oxide films 61 is set to be about several hundred Å according to a driving voltage of the MOSFET. Moreover, conductive materials are embedded in the trenches 57 to provide gate electrodes 63. Each of the conductive material is, for example, polysilicon, and p type impurities, for example, are introduced into the polysilicon to reduce resistance.

Source regions 65 are diffusion regions obtained by implanting high concentration of p type impurities into the surface of the channel layer 54 adjacent to the trenches 57. Moreover, in the surface of the channel layer 54 between the adjacent source regions 65, body regions 64 which are diffusion regions of high concentration of n type impurities are provided to stabilize the potential of the substrate. Accordingly, each portion surrounded by the corresponding adjacent trenches 57 serves as one of cells of the MOS transistor, and a number of these cells form the element region E of the MOSFET.

The gate electrodes 63 are covered with interlayer insulating films 66. A source electrode 67 is a metal electrode obtained by patterning a metal layer such as aluminum (Al) into a desired shape. The source electrode 67 is provided so as to cover the element region E, and is connected to the source regions 65 and the body regions 64 through contact holes between the interlayer insulating films 66.

The gate electrodes 63 are drawn onto the third n type semiconductor layer 23 outside the element region E by use of a conductive material such as a polysilicon layer, and are connected to gate pad electrodes (not shown).

A drain electrode 68 is provided on the same principal surface as the source electrode 67 and comes into contact with the conductive region 44.

Figure 2:
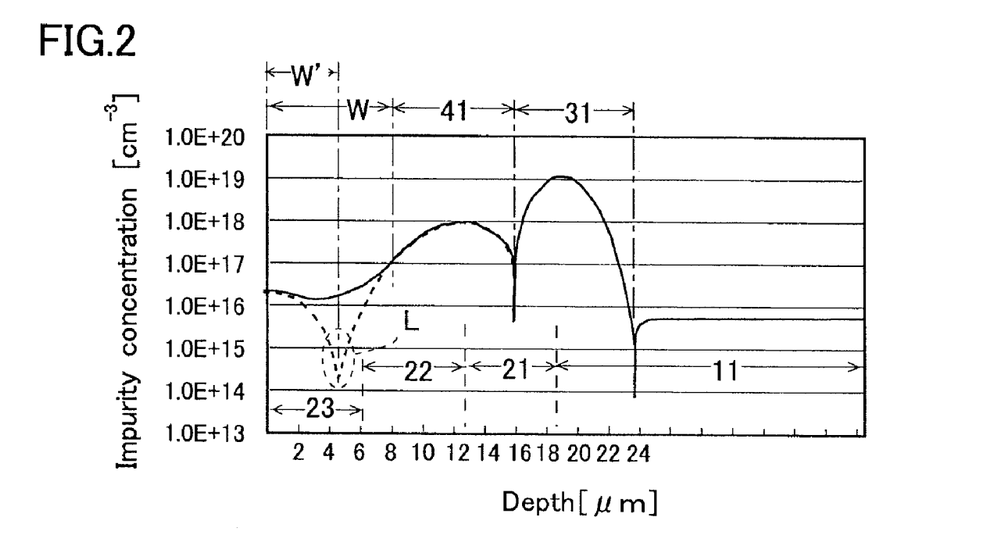
FIG. 2 is a graph showing an impurity concentration profile of the insulated gate semiconductor device according to the preferred embodiment of the invention.

FIG. 2 shows an impurity concentration profile from the surface of the third impurity region 43 to the p type silicon semiconductor substrate 11 in the preferred embodiment. The concentrations given in FIG. 2 are the total concentrations of impurities, i.e., n type impurities plus p type impurities. A solid line indicates the impurity concentration profile of the preferred embodiment and a broken line indicates an impurity concentration profile of a substrate in a conventional structure for comparison.

A horizontal axis represents a depth from the surface of the third n type semiconductor layer 23 and a vertical axis represents impurity concentrations of the first p type impurity region 41, the p type well region W (the second and third p type impurity regions 42 and 43), the n type impurity region 31, and the p type silicon semiconductor substrate 11.

In the conventional structure (see FIG. 10), the impurity concentration decreases, for example, to about $1E14$ cm$^{-3}$ at the bottom portion of the p type well region W', specifically at a portion about 4.5 µm depth away from the surface. The impurity concentration of the p well region required to secure a predetermined breakdown voltage is, for example, about $1E16$ cm$^{-3}$. Moreover, in order to secure the breakdown voltage, it is required to allow a sufficient depletion layer to spread in the p type well region.

However, in the case of the conventional structure shown with the broken line in FIG. 2, a desired impurity concentration is obtained only up to about 2 µm from the surface.

Meanwhile, also conceivable is a method of diffusing the p type buried region that is a high concentration impurity region upward by heat treatment in order to compensate for a low impurity concentration region L (circled portion). However, although a sudden drop in the impurity concentration can be compensated for by the upward diffusion, boron forming the buried region has a large diffusion coefficient, thereby causing a problem that a region having an impurity concentration which enables a desired breakdown voltage to be secured is narrowed after all by excessive swelling of the high concentration impurity region.

Moreover, it is also conceivable to perform ion implantation in the low concentration region L in order to compensate for the lowered impurity concentration. However, there is a problem that it is difficult to perform the ion implantation at the depth of, for example, 4.5 µm from the surface even by use of high acceleration energy.

In the preferred embodiment, the second p type impurity region 42 is provided on the first p type impurity region 41 (corresponds to the conventional buried region 113) and the third p type impurity region 43 is provided thereon. The p type well region W is formed of both of the second and third p type impurity regions 42 and 43. In this way, the lowered impurity concentration at the bottom of the third p type impurity region 43 (corresponds to the conventional p type well region W') can be compensated for by the second p type impurity region 42.

Therefore, according to the preferred embodiment, the impurity concentration suitable for securing the breakdown voltage can be maintained in an approximately uniform state (approximately flat state in the impurity concentration profile) up to the depth of about 6 μm from the surface. Thus, an approximately uniform impurity concentration and the depth of the p well region W that are sufficient to secure the breakdown voltage can be secured. Furthermore, the breakdown voltage can also be improved.

With reference to FIGS. 3A to 9B, description will be given of a method for manufacturing an insulated gate semiconductor device of a preferred embodiment of the present invention.

Figure 3A:
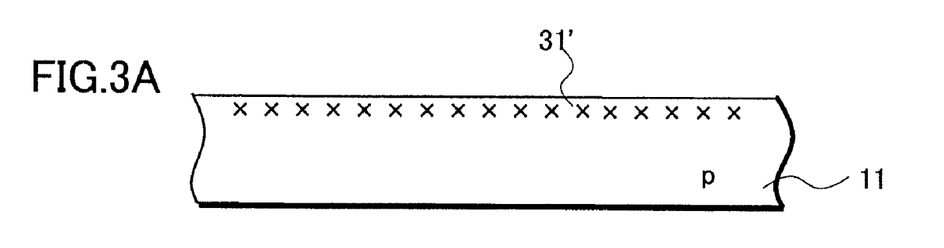
FIGS. 3A and 3B are cross-sectional views for explaining a method for manufacturing the insulated gate semiconductor device according to the preferred embodiment of the invention.
Figure 3B:
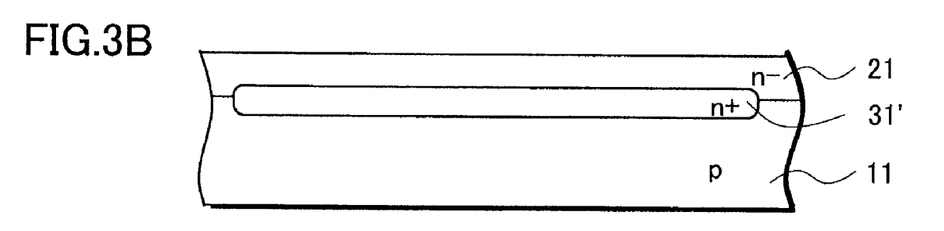

First Step (FIGS. 3A and 3B). After preparing a p type silicon semiconductor substrate 11 (impurity concentration of about $1.0E15$ to $1.0E16$ $cm^{-3}$), a mask having an opening in a desired region is provided thereon and high concentration (about $1.0E19$ $cm^{-3}$) of n type impurities (for example, antimony (Sb)) 31' are implanted (FIG. 3A).

Thereafter, an n type impurity region 31' is formed by diffusing the impurities. Furthermore, a first n type semiconductor layer 21 is formed by, for example, epitaxial growth or the like on the p type silicon semiconductor substrate 11. An impurity concentration of the first n type semiconductor layer 21 is, for example, about $4.0E15$ $cm^{-3}$ (specific resistance=1.2 Ω·cm) and a thickness thereof is, for example, 6 μm. The n type impurities 31' are diffused slightly upward and downward (FIG. 3B).

Figure 4A:
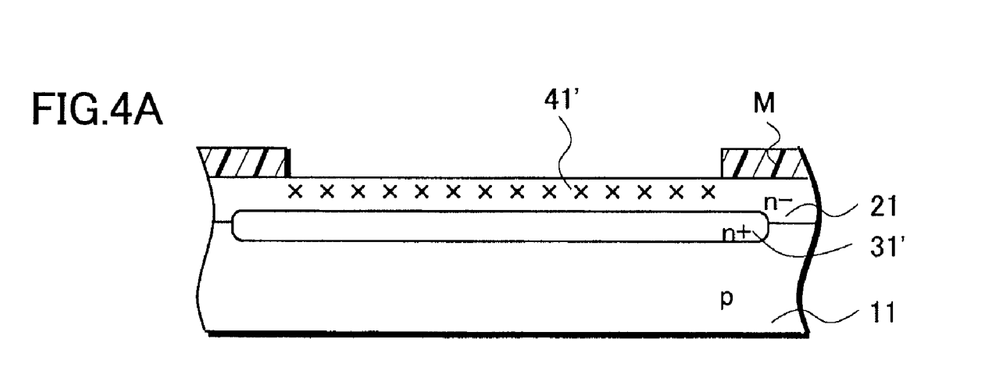
FIGS. 4A and 4B are cross-sectional views for explaining the method for manufacturing the insulated gate semiconductor device according to the preferred embodiment of the invention.
Figure 4B:
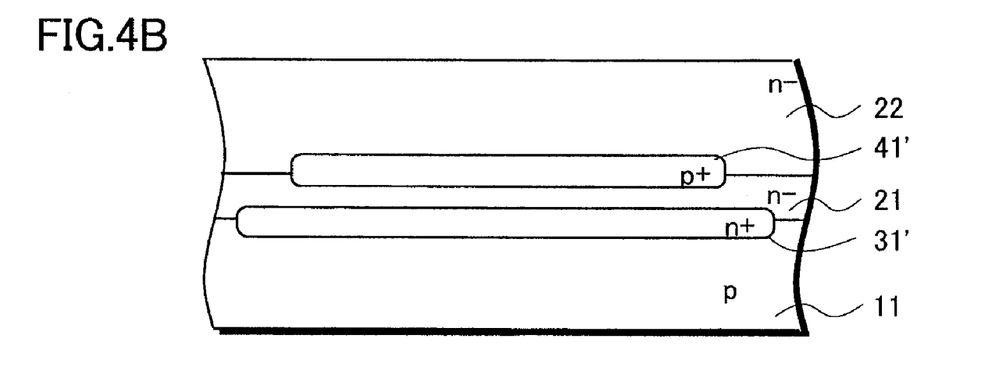

Second Step (FIGS. 4A and 4B). After forming a thermally-oxidized film (not shown) in a thickness of about 400 Å on the surface of the first n type semiconductor layer 21, a mask M having an opening in a desired region is provided thereon and ions of high concentration (about $1.0E18$ $cm^{-3}$) of first p type impurities (for example, boron) 41' are implanted. Ion implantation conditions include, for example, a dose amount of $1E15$ $cm^{-2}$ and an implantation energy of 160 KeV (FIG. 4A).

Thereafter, a second n type semiconductor layer 22 is formed by, for example, epitaxial growth or the like on the first n type semiconductor layer 21. An impurity concentration of the second n type semiconductor layer 22 is, for example, about $4.0E15$ $cm^{-3}$ (specific resistance=1.2 Ω·cm) and a thickness thereof is, for example, 7 μm to 10 μm. The first p type impurities 41' are diffused slightly upward and downward (FIG. 4B).

Figure 5A:
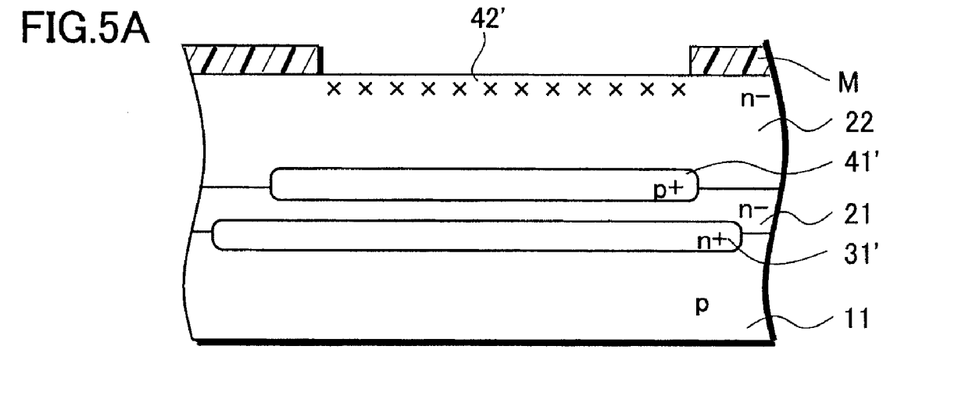
FIGS. 5A, 5B, and 5C are cross-sectional views for explaining the method for manufacturing the insulated gate semiconductor device according to the preferred embodiment of the present invention.
Figure 5B:
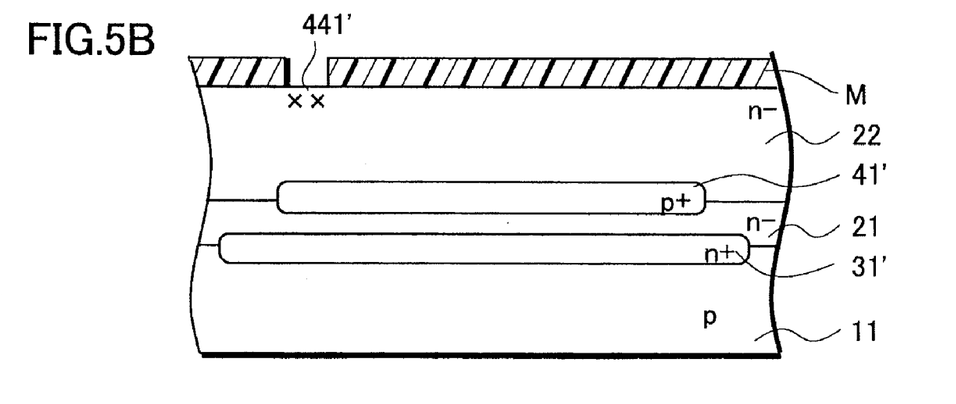
Figure 5C:
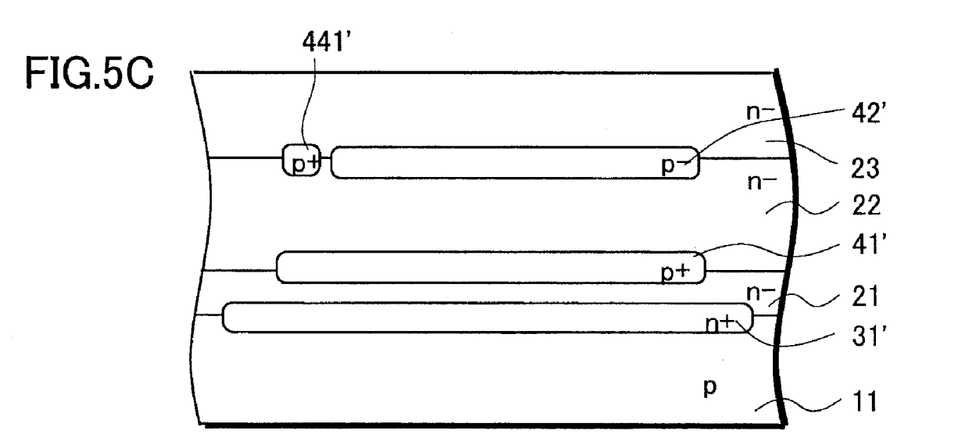

Third Step (FIGS. 5A, 5B, and 5C). After forming a thermally-oxidized film (not shown) in a thickness of about 400 Å on the surface of the second n type semiconductor layer 22, a new mask having an opening in a desired region is provided thereon, and ions of second p type impurities (for example, boron) 42' having an impurity concentration of about $1.0E16$ $cm^{-3}$ are implanted. Ion implantation conditions include a dose amount of $1.0E13$ $cm^{-2}$ and an implantation energy of, for example, 160 KeV (FIG. 5A).

Moreover, ions of p type first conductive region forming impurities (for example, boron) 441' are implanted outside the implantation region of the second p type impurities 42'. Ion implantation conditions include a dose amount of $1E15$ $cm^{-2}$ and an implantation energy of 160 KeV (FIG. 5B).

Thereafter, a third n type semiconductor layer 23 is formed by, for example, epitaxial growth or the like on the second n type semiconductor layer 22. An impurity concentration of the third n type semiconductor layer 23 is, for example, about $4.0E15$ $cm^{-3}$ (specific resistance=1.2 Ω·cm) and a thickness thereof is, for example, 6 μm to 10 μm. The second p type impurities 42' and the first conductive region forming impurities 441' are diffused slightly upward and downward (FIG. 5C).

Figure 6:
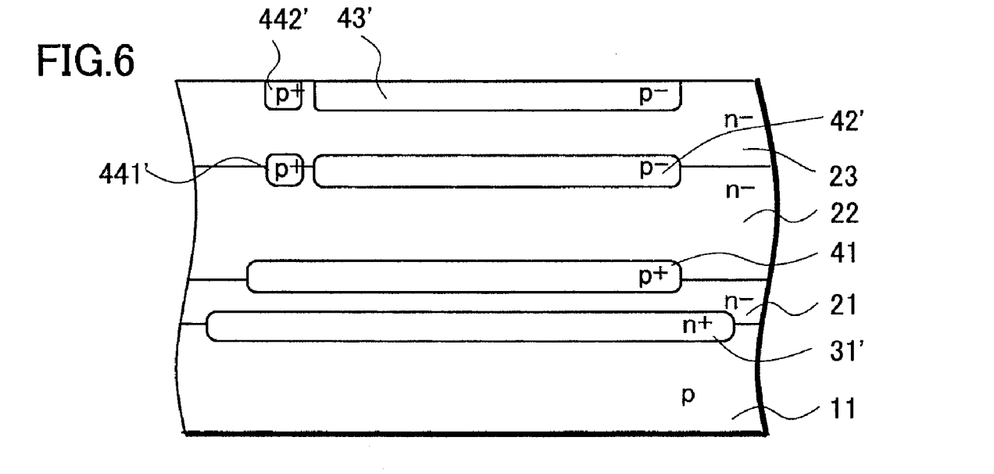
FIG. 6 is a cross-sectional view for explaining the method for manufacturing the insulated gate semiconductor device according to the preferred embodiment of the present invention.

Fourth Step (FIG. 6). After forming a thermally-oxidized film (not shown) in a thickness of about 400 Å on the surface of the third n type semiconductor layer 23, a new mask having an opening in a desired region is provided thereon, and ions of third p type impurities (for example, boron) 43' in an impurity concentration of about $1.0E16$ $cm^{-3}$ are implanted. Ion implantation conditions include, for example, a dose amount of $1.0E13$ $cm^{-2}$ and an implantation energy of 160 KeV.

Moreover, ions of high concentration (about $1.0E18$ $cm^{-3}$) of p type second conductive region forming impurities 442' are implanted outside the implantation region of the third p type impurities 43'. Ion implantation conditions include, for example, a dose amount of $1.0E15$ $cm^{-2}$ and an implantation energy of 160 KeV.

Figure 7:
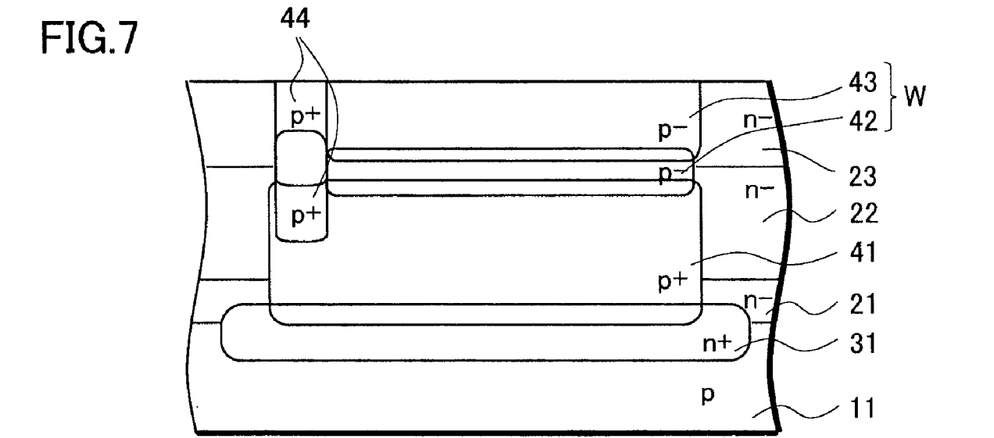
FIG. 7 is a cross-sectional view for explaining the method for manufacturing the insulated gate semiconductor device according to the preferred embodiment of the present invention.

Fifth Step (FIG. 7). The implanted first to fourth p type impurities 41' to 44' are diffused by heat treatment (for example, at 1230° C. for 4 hours). Thus, the n type impurity region 31 and the first to third p type impurity regions 41 to 43 are formed, respectively. Moreover, the first and second conductive region forming impurities 441' and 442' are diffused. The two regions diffused upward and downward overlap partially with each other to form a conductive region 44 extending to the first p type impurity region 41 from the surface of the third n type semiconductor layer 23.

The n type impurity region 31 is buried in such a depth that the n type impurity region 31 extends to the p type silicon semiconductor substrate 11 from the first n type semiconductor layer 21, and suppresses a parasitic bipolar action.

The first p type impurity region 41 is buried in such a depth that the first p type impurity region 41 extends to the first n type semiconductor layer 21 from the second n type semiconductor layer 22. The second p type impurity region 42 is buried in such a depth that the second p type impurity region 42 extends to the second n type semiconductor layer 22 from the third n type semiconductor layer 23. Moreover, the third p type impurity region 43 is provided in the third n type semiconductor layer 23 and has its bottom portion coming into contact with the second p type impurity region 42.

The second and third p type impurity regions 42 and 43 form a p type well region W. Moreover, together with the p type well region W, the first p type impurity region 41 serves as a drain region of the MOSFET to be formed later.

The conductive region 44 formed outside the second and third p type impurity regions 42 and 43 serves as a conductive path for drawing a drain current to the surface of the substrate.

As described above, in the preferred embodiment, the n type semiconductor layer which forms the p type well layer W is divided into the second n type semiconductor layer 22 and the third n type semiconductor layer 23. Further, the second p type impurities 42' are implanted into the surface of the second n type semiconductor layer 22 and the third p type impurities 43' are implanted into the surface of the third n type semiconductor layer 23.

Thereafter, the second and third p type impurities 42' and 43' are diffused by heat treatment to form the p type well layer W. Between the third p type impurity region 43 and the first p type impurity region 41, the second p type impurity region 42 having its upper and lower portions overlapping therewith can be formed. Thus, reduction in the impurity concentration at the bottom portion of the well layer W can be suppressed.

Furthermore, since the respective regions can be simultaneously formed by single heat treatment, the manufacturing steps can be reduced and a time required for the manufacturing steps can be shortened. Since a total number of times of heat treatment during the manufacturing steps can be reduced, diffusion of the high concentration first p type impurity region 41 can be suppressed. Specifically, diffusion in the horizontal direction of the substrate (lateral diffusion) can also be suppressed. Thus, a size of the semiconductor device can be reduced.

Figure 8A:
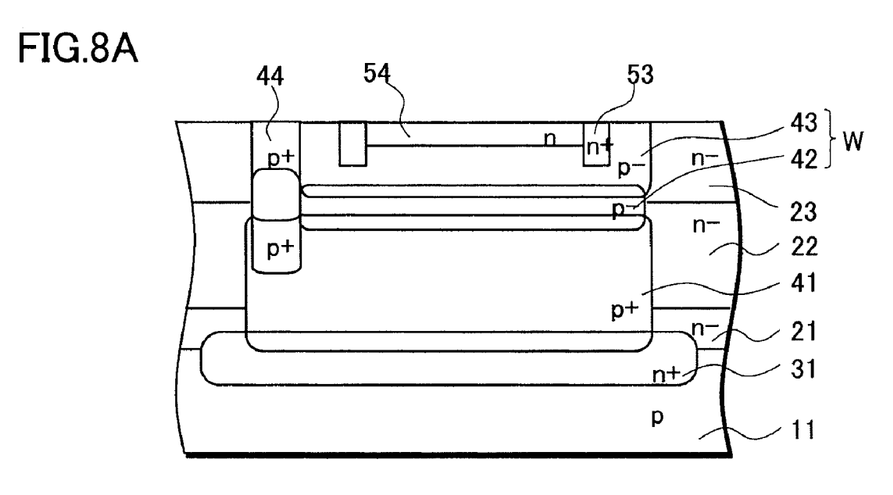
FIGS. 8A and 8B are cross-sectional views for explaining the method for manufacturing the insulated gate semiconductor device according to the preferred embodiment of the present invention.
Figure 8B:
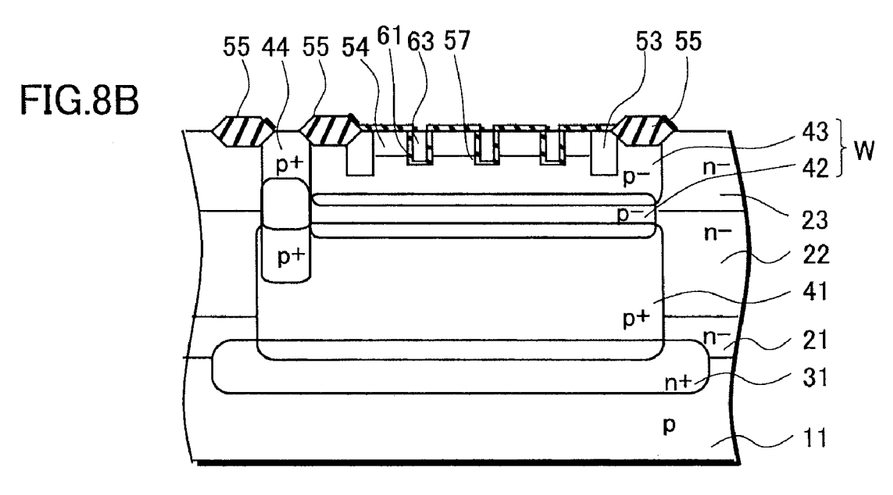

Sixth Step (FIGS. 8A and 8B). On the surface of the p type well region W (the third p type impurity region 43), a mask made of an oxide film (not shown) or the like is provided, and then high concentration (about $1.0E17$ $cm^{-3}$) of n type impurities are implanted and diffused to form a guard ring 53. Moreover, n type impurities (for example, phosphorus (P)) are implanted (for example, a dose amount of about $1.0E13$ $cm^{-2}$ and an implantation energy of 140 KeV) at an inner side of the guard ring 53 and then diffused to form a channel layer 54 (impurity concentration: $2.0E16$ $cm^{-3}$) (FIG. 8A).

After a LOCOS oxide film 55 is formed around the element region, a CVD oxide film made of non-doped glass (NSG) is generated by use of a CVD method on the entire surface to form a mask for forming trenches, the mask having desired openings. Then, the substrate is dry-etched with CF— and HBr-base gases. Accordingly, trenches 57 are formed, which penetrate the channel layer 54 and extend to the third p type impurity region 43.

Subsequently, dummy oxidation is performed to form dummy oxide films (not shown) on inner walls of the trenches 57 and on a surface of the channel layer 54, thereby remove etching damage inflicted during the dry etching. Thereafter, the dummy oxide films formed by the dummy oxidation and the CVD oxide film are simultaneously removed by an oxide film etchant such as hydrofluoric acid. Thereby, a stable gate oxide film can be formed. Moreover, the openings of the trenches 57 are rounded by high-temperature thermal oxidation, which provides an effect of avoiding an electric field concentration in the openings of the trenches 57. Thereafter, a gate oxide film 61 is formed. Specifically, the entire surface is thermally oxidized to form the gate oxide film 61 in a thickness of several hundred Å according to a threshold.

Furthermore, a non-doped polysilicon layer (not shown) is deposited on the entire surface, and p type impurities (such as boron) are implanted and diffused (impurity concentration: about $1E19$ $cm^{-3}$), in order to increase conductivity. Moreover, a polysilicon layer previously doped with p type impurities may be deposited on the entire surface. The polysilicon layer deposited on the entire surface is dry-etched without using a mask, so as to form gate electrodes 63 formed of the polysilicon layers buried in the trenches 57 (FIG. 8B).

Figure 9A:
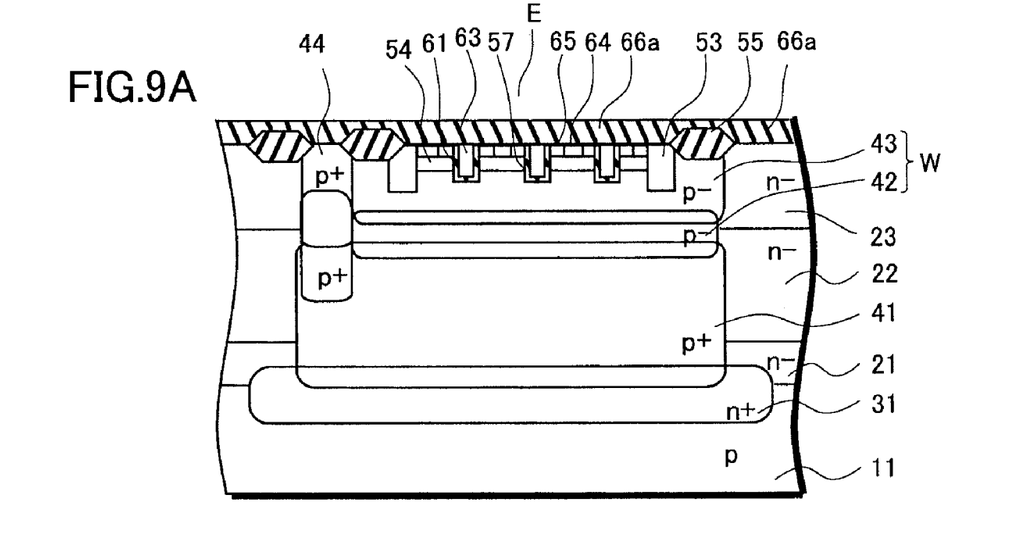
FIGS. 9A and 9B are cross-sectional views for explaining the method for manufacturing the insulated gate semiconductor device according to the preferred embodiment of the present invention.

Thereafter, a new resist mask (not shown) is provided to selectively perform ion implantation of p type impurities (for example, boron) and ion implantation of n type impurities (for example, arsenic).

Subsequently, a boron phosphorus silicate glass (BPSG) layer 66a is deposited on the entire surface by use of the CVD method. The implanted p type impurities and n type impurities are then diffused in the surface of the substrate. Thus, p+ type source regions 65 are formed in the surface of the channel layer 54 adjacent to the trenches 57, and n type body regions 64 are formed in the surface of the substrate between the adjacent source regions 65 (FIG. 9A).

Figure 9B:
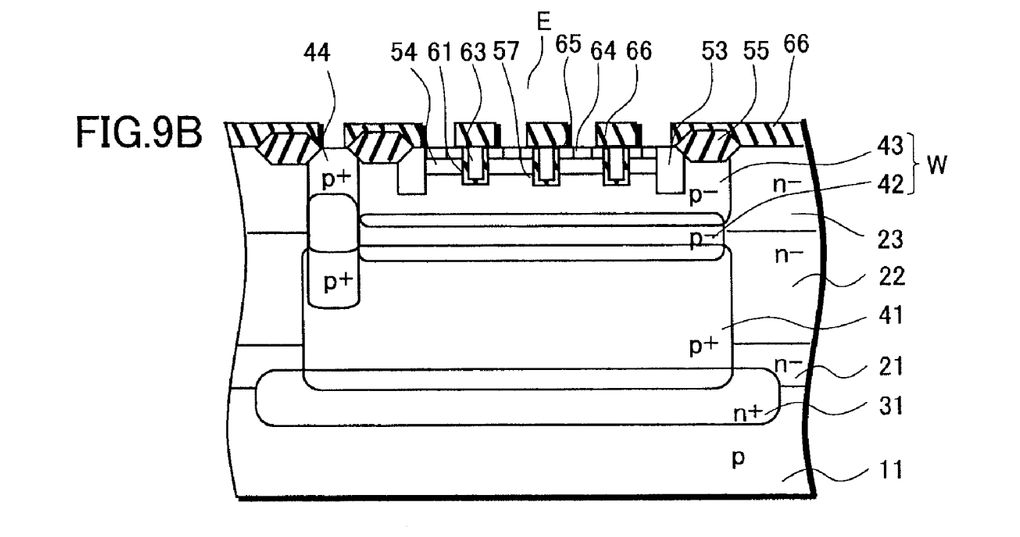

The BPSG film 66a is etched by use of the resist mask so as to leave interlayer insulating films 66 at least on the gate electrodes 63. Each of the interlayer insulating films 66 having a thickness of, for example, about 8000 Å is provided to cover the opening of the corresponding trench 57 (FIG. 9B).

Seventh Step. Subsequently, a metal layer (for example, an Al/Si layer) is sputtered on the entire surface. A thickness of the metal layer is, for example, about 2 μm. The metal layer is patterned into a desired wiring shape to form a source electrode 67 connected to the source regions 65.

Moreover, a drain electrode 68 is formed, which comes into contact with the conductive region 44. Furthermore, although not shown here, gate pad electrodes connected to the gate electrodes 63 are also formed by patterning the same metal layer. Consequently, a final structure shown in FIG. 1 is obtained.

According to the present invention, the following effects can be achieved.

First, an impurity concentration profile of a p type well region can be set approximately uniform by having a configuration in which: a conventional p type well region are formed of two layers of second and third p type impurity regions; and the second and third p type impurity regions overlap with each other to compensate for a low concentration impurity region near a bottom portion of the third p type impurity region.

Thus, in a current path in the up-drain structure, an increase in resistance can be suppressed and on-resistance can be reduced.

Second, it is possible to obtain the impurity concentration profile in which the impurity concentration is gradually increased from the p type well region to a high concentration first p type impurity region. Thereby, the impurity concentration at a bottom portion of the p type well region can be increased, and thus the p type well region having an approximately uniform impurity concentration can be obtained.

Specifically, the p type well region having an approximately uniform impurity concentration from the surface to a desired depth can be obtained, which allows the p type well region to be formed deeper than the conventional one. Thus, an impurity concentration and a depth which are sufficient to secure a breakdown voltage can be secured. Furthermore, the breakdown voltage can also be improved. To be more specific, a MOSFET having a p channel trench structure with a breakdown voltage of about 20 V to 100 V can be realized.

Third, the formation of the deep p type well region with the approximately uniform impurity concentration contributes to reduction in the on-resistance.

Fourth, since diffusion of the first p type impurity region can be suppressed, diffusion in the horizontal direction of the substrate (lateral diffusion) can also be suppressed. Thus, miniaturization of the semiconductor device is realized.

Moreover, according to the manufacturing method of the present invention, the second and third p type impurity regions serving as the p type well region can be formed by stacking n type semiconductor layers, on one another, having ions of p type impurities implanted into their surfaces. Thus, in a deep region where ion implantation from its surface is difficult to perform, the impurity concentration of the p type well region can be compensated for.

The low concentration region at the bottom portion of the p type well region has a depth (for example, 4 μm to 5 μm) at which the ion implantation is difficult to perform even by use of high ion implantation energy (for example, 1000 KeV). In the preferred embodiment, the p type well region can be formed by stacking the n type semiconductor layers, on one another, having the p type impurities implanted into their surfaces and by diffusing the p type impurities upward and downward. Thus, the impurity concentration at the bottom portion of the p type well region can be increased without performing the ion implantation into the deep region.

What is claimed is:

1. An insulated gate semiconductor device comprising:
a p type semiconductor substrate;
a first n type epitaxial semiconductor layer grown on the semiconductor substrate;
a second n type epitaxial semiconductor layer grown on the first n type semiconductor layer;
a third n type epitaxial semiconductor layer grown on the second n type semiconductor layer;
an n type impurity-diffusion region buried between the semiconductor substrate and the first n type semiconductor layer;
a first p type impurity-diffusion region buried between the first n type semiconductor layer and the second n type semiconductor layer;
a second p type impurity-diffusion region buried between the second n type semiconductor layer and the third n type semiconductor layer so as to be in contact with the first p type impurity-diffusion region;
a third p type impurity-diffusion region formed in the third n type semiconductor layer so as to be in contact with the second p type impurity region;
a region formed in the third p type impurity-diffusion region and comprising insulated gate semiconductor elements;
a conductive region formed in the second and third n type epitaxial semiconductor layers outside the second and third p type impurity-diffusion regions so as to reach the first p type impurity-diffusion region;
first and second electrodes connected to the region comprising insulated gate semiconductor elements; and
a third electrode connected to the conductive region.

2. The insulated gate semiconductor device of claim 1, wherein the second and third p type impurity-diffusion regions each have an impurity concentration lower than an impurity concentration of the first p type impurity-diffusion region.

3. The insulated gate semiconductor device of claim 2, wherein the second and third p type impurity-diffusion regions have the same impurity concentration.

* * * * *